US005739724A

United States Patent [19]

Alexandre et al.

[11] Patent Number: 5,739,724

[45] Date of Patent: Apr. 14, 1998

[54] CONTROL OF OSCILLATOR FOR DRIVING POWER ULTRASONIC ACTUATORS

[75] Inventors: Patrick Alexandre, Metz; Pierre Claessen, Mareil S/Mauldre; Guy Joannes, Ecquevilly; Michel Nogues, Triel S/Seine, all of France

[73] Assignee: Sollac and Ascometal S.A., Puteaux, France

[21] Appl. No.: 738,410

[22] Filed: Oct. 25, 1996

[30] Foreign Application Priority Data

Oct. 27, 1995 [FR] France ........................ 95 12900

[51] Int. Cl.$^6$ ........................ B06B 1/06; H03L 7/00

[52] U.S. Cl. ........................ 331/1 R; 331/14; 331/17; 310/316; 318/116

[58] Field of Search ........................ 331/1 R, 14, 17; 310/316; 318/116

[56] References Cited

U.S. PATENT DOCUMENTS

| | | | |
|---|---|---|---|
| 4,808,948 | 2/1989 | Patel et al. | 331/4 |
| 4,879,528 | 11/1989 | Gotanda | 331/25 |
| 4,970,656 | 11/1990 | Lo et al. | 331/36 R |

FOREIGN PATENT DOCUMENTS

| | | |
|---|---|---|
| A-217694 | 4/1987 | European Pat. Off. . |
| A-359217 | 3/1990 | European Pat. Off. . |
| A-662356 | 7/1995 | European Pat. Off. . |

*Primary Examiner*—Siegfried H. Grimm
*Attorney, Agent, or Firm*—Nilles & Nilles, S.C.

[57] ABSTRACT

An oscillator supplies a signal of adjustable frequency to drive power ultrasonic actuators. The oscillator frequency is varied and the phase between the voltage and current of the signal is continuously measured. A computer determines the sign of the variation in the absolute value of the phase in the course of successive sampling cycles of predetermined duration and produces therefrom frequency correction signals for the oscillator. A frequency correction is applied to the oscillator in the same direction as the frequency correction applied previously if the variation in absolute value of the phase is negative, and in the opposite direction if the variation in absolute value of the phase is positive. If the variation in absolute value of the phase is zero, a frequency correction of random sign is applied to the oscillator.

8 Claims, 3 Drawing Sheets

CONTROL OF OSCILLATOR FOR DRIVING POWER ULTRASONIC ACTUATORS

The present invention relates to the use of power ultrasound, and more particularly the driving of elements generating this ultrasound, or actuators, which are used to create vibration at ultrasonic frequency in various devices or apparatus.

Certain applications of power ultrasonics are highly developed, for example for cleaning or degreasing various parts, dishwashing, for example. Other applications, for example in the steelmaking industry, are under development, for example in assistance with acid pickling baths, or in assistance with degreasing solvents, in order to enhance lubrication in continuous casting or in wire drawing, or additionally to promote the precipitation of mattes in plating baths.

The actuators or transducers used to generate the ultrasound are conventionally piezoelectric chips powered by power electrical generators at a predetermined frequency.

In order to be effective in each application, these actuators have to operate at a nominal frequency, or in a restricted range of frequencies, adapted to each application.

Moreover, in order to optimize the overall performance of the acoustic suite, that is to say in order to have the best electrical efficiency of the generator and the best mechanical efficiency of the chips, it is sought to make the assembly operate under conditions of electrical resonance or anti-resonance. In resonance, the voltage and the current supplied by the electrical generator are in phase, and they are phase shifted by 180° in anti-resonance. For the sake of simplicity, the expression "phase" will be used in what follows to designate the phase shift between voltage and current, and "zero phase" for the two cases of operation in phase (resonance) or in phase opposition (anti-resonance).

It is known from the characteristics of the piezoelectric crystals themselves that, for a given voltage, the best vibration amplitude is obtained at resonance, that is to say when the current strength is a maximum. However, for a given power, the vibration amplitude is better at anti-resonance and, in consequence, in the case in which several actuators are connected in parallel on the same power generator, anti-resonance working is generally used to limit the power which it is necessary to supply from the electrical power generator. It is therefore sought, in both cases, in order to optimize the operation, to work at zero or minimum "phase" (that is to say at resonance or at anti-resonance).

Under the practical conditions of use of piezoelectric chips, the said phase, however, tends to vary depending on the environment of the chips, and especially as a function of the power to be transmitted, of the load (and hence of the variations in the operating conditions of the devices to which the vibration is transmitted), of temperature, etc. For example, in the case of the continuous casting of steel in an ingot mould vibrated by ultrasound (as described, for example, in the French patent applications filed under numbers 84.14759 and 89.07839), the variations in the flow of cast metal or of heating, and the phenomena of metal sticking to the walls of the ingot mould create significant and rapid variations in the mechanical load on the chips and thus in the electrical load on the power supply generator.

A phase shift ensues, and thus the phase moves away from its datum value $\Phi_0$ which, as indicated above, is zero.

It is known, in order to bring the phase back to its datum value, to insert, into the actuator control circuit, a slaving device which varies the working frequency, around a nominal frequency $f_0$, depending on the measured phase value, in order to bring it back to the datum value $\Phi_0=0$ which corresponds to optimal efficiency of the system. The frequency of the vibrations is then equal to the resonance or anti-resonance frequency. The nominal frequency $f_0$ is predetermined on the basis of the particular application in question. Known slaving systems are analog regulators of PID type (proportional, integral, derivative). Such slaving systems are known particularly from the French patent application number 88.16159 which describes a system particularly including:

- a current sensor and a voltage sensor for supplying signals representative of the current and to the voltage at the output of a controlled-frequency oscillator driving the piezoelectric actuators,
- a phase comparator for producing a signal representative of the phase shift between the current and the voltage,
- an oscillator control circuit for controlling the frequency as a function of the phase shift, so as constantly to bring the latter towards the zero value.

The document EP-A-0217694 also describes a method of this type, in which the frequency is altered as a function of an observed phase shift and of the direction of this shift, in the direction required by the said direction of the phase shift, until the phase difference disappears or reaches a predetermined limit value.

However, it has been observed, particularly on continuous-casting industrial installations, that such slaving systems did not always function correctly, and sometimes required intervention by the operators in the course of casting in order to set the frequency manually, so as to reestablish correct operation of the installation. It was noted that these problems appeared essentially when several actuators were mounted on the same structure to be vibrated, such as a continuous-casting ingot mould, and in parallel on the same generator or oscillator.

Similar problems exist in the case of other applications of power ultrasound, when the load is variable.

The object of the present invention is to solve the problems set out above, and it is aimed, in particular, at allowing reliable driving of power ultrasonic actuators allowing optimal operation of the system whatever the load variations. It also aims to supply a device for driving power ultrasonic actuators which can be used whatever the application envisaged, and hence which allows reliable driving over a wide range of nominal frequencies and also whatever the number and the configuration of the actuators used.

With these objectives in view, the subject of the invention is a method of driving power ultrasonic actuators, which are used to generate power ultrasound in an installation, according to which the frequency of an oscillator for driving the said actuators is adjusted as a function of the phase between the voltage and the current strength of the signal supplied by the said oscillator.

According to the invention, the method is characterized in that, before putting the installation into service, a nominal frequency of the signal is determined, depending on the said installation, and, when the installation is put into service:

- the said phase is continuously measured,
- a measurement sampling cycle is defined having a determined period,
- the sign of the variation in the absolute value of the phase is determined in the course of each sampling period,
- and a frequency correction is applied to the frequency of the oscillator, in the same direction as the frequency correction applied previously if the variation in absolute value of the phase is negative, and in the opposite direction if the variation in absolute value of the phase is positive, and, if the variation in absolute value of the phase is zero, a frequency correction of random sign is applied.

The method according to the invention makes it possible continuously to optimize the operation of the system by adjusting the frequency of the oscillator so as continuously to minimise the absolute value of the phase, whatever the actuator configurations and the disturbances which may be caused during operation of the installation vibrated.

In contrast to the known slaving systems which are based on the use of a phase-locked loop and of a regulator of PID type, the method according to the invention makes it possible to ensure optimal operation whatever the characteristics of the vibrating structure, and can therefore be used for very varied applications. Moreover, the invention makes it possible to ensure reliable slaving of the frequency to the phase, even when the characteristics of the installation and its operating conditions lead to very irregular or abrupt variations in the phase.

In fact, in conventional slaving systems, based on the search for zero phase corresponding to operation at resonance or at anti-resonance, it is considered that, in the vicinity of the optimal frequency, the phase varies in a continually increasing way as a function of the actual frequency of the ultrasonic vibration, as is represented in FIG. 2*a* which represents the variation sin phase as a function of frequency in the case of a low apparent quality factor Q of the piezoelectric assembly. The slaving therefore consists in comparing the value of the measured phase with a datum value (which is conventionally $\Phi_0=0$), and in adjusting the frequency of the oscillator as a function of the result of this comparison in order to bring the phase back to its datum value. A problem appears with such a slaving system when the characteristics of the installation or its operating conditions mean that the phase does not vary continuously as a function of frequency. Such a case is illustrated by FIG. 2*b*, which represents the phase as a function of frequency in an assembly with a high quality factor Q. Moreover, and in particular when several actuators are mounted on the same mechanical structure to be vibrated, the response curves may be very complex, since all the actuators are not perfectly identical or all age differently. In such cases, the existence of an operating point at zero phase, within the range of working frequency for running the installation, is not assured, (as is illustrated in FIG. 2*c* which will be seen later).

Taking this latter case as an example, it will easily be understood that slaving according to the prior art cannot operate correctly since two points exist, situated on the curve, on either side of the optimal frequency $f_0$, for which the value of the phase is identical, and such a slaving system cannot then determine in which direction the frequency has to be altered in response to a measured phase value.

These problems explain the malfunctions observed with industrial installations using regulation of PID type, which led the operators to intervene manually to correct the frequency of the oscillator.

These problems are overcome, by virtue of the method according to the invention, since the frequency correction applied is not in the first place, a function of the value of phase but of the direction of a variation in phase caused by a deliberate variation of the frequency. Put another way, the changes in the phase are observed over a predetermined sampling period and, if the phase increases, the frequency is varied in the inverse direction to the frequency variation which cause the said phase variation, and, if the phase reduces, the frequency continues to be varied in the direction which led to this phase reduction.

Put another way, in the known methods, it is always sought, by varying the frequency, to cancel out the phase shift, or at least to reduce it, assuming that the zero-phase-shift operating point exists and that the phase shift changes direction on either side of this point. These methods can therefore not be applied in the case of systems the operation of which corresponds to FIG. 2*c*. In contrast thereto, in the method according to the invention, it is still sought to reduce or cancel out the phase shift, but on the basis of the observed changes therein in response to a previously applied frequency variation, hence without there being any need for a zero-phase operating point and change in direction of the phase shift on either side of the optimal operating point.

Given that the duration of the sampling period is adequate for the changes in phase in the course of one period to be representative of the effect caused by a frequency variation applied at the start of this period, that is to say that the sampling period is greater than the response time of the system, it is then possible to observe, at the end of this period, whether the said frequency variation is or is not favourable to a reduction in the absolute value of the phase, and for the following period, to adjust the direction of variation of the frequency. It will be noted that this adjustment is carried out without the need to know the value of the frequency, and in particular even if no zero-phase operating point exists in the frequency bracket suitable for the application in question.

It may happen that the phase variation detected in the course of a sampling period is zero or substantially zero. In such a case, which particularly corresponds to an operating point of the system at minimum phase (peak of the curve of FIG. 2*b*), with the system unable to know what frequency correction to apply in order to have a beneficial effect on the reduction in phase, a frequency correction of random sign is then applied, and the variation in phase thus caused will make the system come back into the previously described operating mode.

In order to enhance the dynamic range of the system, the amplitude of the frequency correction applied is preferably a function of the difference between the measured phase value and the datum value $\Phi_0=0$. For example, if the said phase is zero or less than a first predetermined threshold, the frequency correction is zero. If the said phase is less than a second predetermined threshold, the frequency correction is constant. And if the said phase is greater than the second predetermined threshold, the frequency correction increases as a function of phase. That being so, these thresholds could be fixed once and for all for each application.

A further subject of the invention is a device for driving power ultrasonic actuators including:

an oscillator supplying a signal of adjustable frequency means of measuring the phase between the voltage and the current strength of the said signal a computer for determining the direction of variations of the phase in the course of a cycle of predetermined duration and for calculating and applying a frequency correction of the signal to the oscillator as a function of the said direction of variation of the phase, the said frequency correction being in the same direction as the frequency correction applied in the course of the said cycle if the variation in absolute value of the phase is negative in the course of this cycle, and in the opposite direction if the variation in absolute value of the phase is positive, and, if the variation in absolute value of the phase is zero, a frequency correction of random sign is applied.

Other characteristics and advantages will emerge in the description which will be given, by way of example, of the application of the invention to the driving of transducers used to generate ultrasound in a continuous steel-casting ingot mould.

Reference will be made/the attached drawings in which:

FIG. 1 is an overall theoretical diagram of the ultrasound generation system;

FIGS. 2*a*, 2*b* and 2*c* represent three typical possible cases of variation of the phase as a function of frequency;

Figure 1:
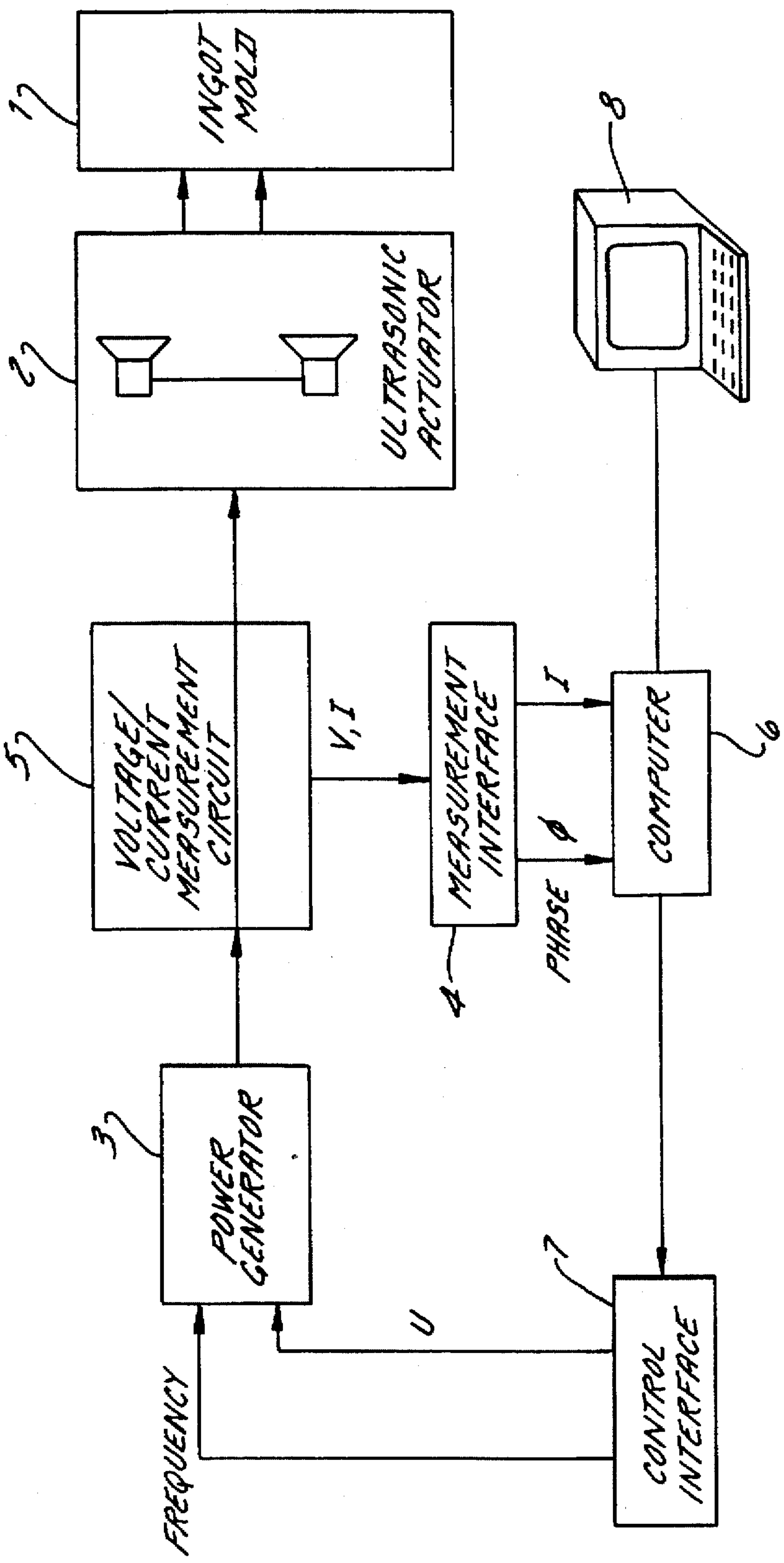
Figures 2A, 2B, 2C:
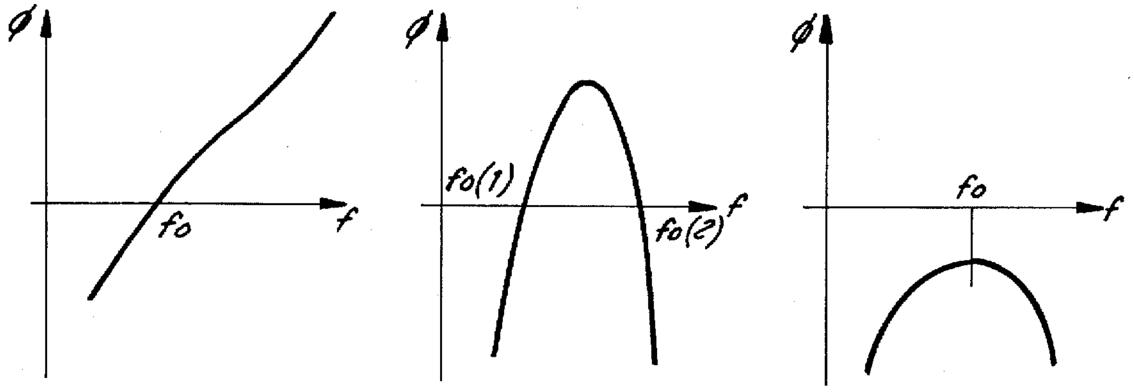

The ingot mould 1 and the ultrasonic actuators 2 which, in a known way, consist of piezoelectric elements fixed to the ingot mould and powered by an electric power generator or oscillator 3, are represented symbolically on the drawing of FIG. 1. It should be noted, especially in this particular application but also in other applications in which the vibration power to be supplied is considerable, that several transducers are conventionally used, such as piezoelectric chips, fixed to the structure to be vibrated at various sites and supplied in parallel by the same power generator.

A measurement interface circuit 4 is linked to means 5 of measuring the voltage and the strength of the current supplied by the power generator. This interface circuit supplies a computer 6 with signals representative of the strength of the current I and of the phase Φ between the voltage and the current.

The computer 6 is linked to a control interface circuit 7 which drives the power generator, supplying it with frequency and voltage control signals.

A keyboard and a visual display screen 8 are linked to the computer in order to allow an operator to set the parameters specific to the installation and to its operation, and to control the initialization, start-up and shutdown of the system, and to view the state of the system and to supply alarms in the event of malfunction.

Figure 3:
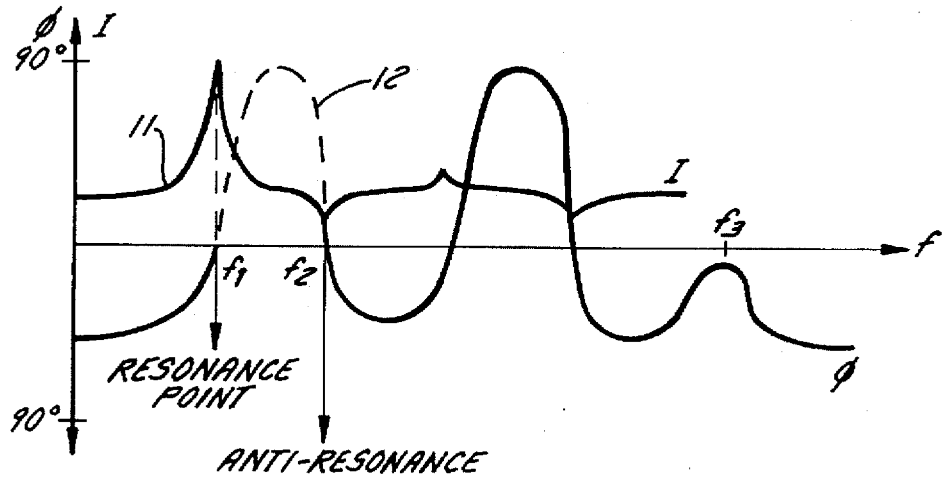
FIG. 3 is a simplified representation of possible variations of the phase and of the strength of the current supplied by the oscillator as a function of frequency.

FIG. 3 shows, in a simplified manner and by way of explanation, the variations in the strength of the current I (curve 11) and in the phase Φ between voltage and current (curve 12) as a function of the frequency f of the ultrasound applied to a vibrating structure. At the frequency $f_1$, corresponding to operation at resonance, the phase Φ is zero and the current is a maximum. At the frequency $f_2$, corresponding to operation at anti-resonance, the phase Φ is also zero but the current is a minimum. At the frequency $f_3$, the absolute value of the phase exhibits a minimum. In practice, these curves may be much more complex, the curves of this figure being intended solely to illustrate the fact that, depending on the frequency bracket in which it is desired to cause the structure to vibrate, there may exist several frequencies at which the phase is zero, or, conversely, ranges of frequencies where it is not possible to obtain zero phase.

Moreover, in an industrial installation such as, for example, a continuous-casting ingot mould, the vibratory characteristics of the structure vibrated may vary greatly over time, which has the effect of altering the optimum vibration frequency at any moment while the installation is operating.

Figure 4:
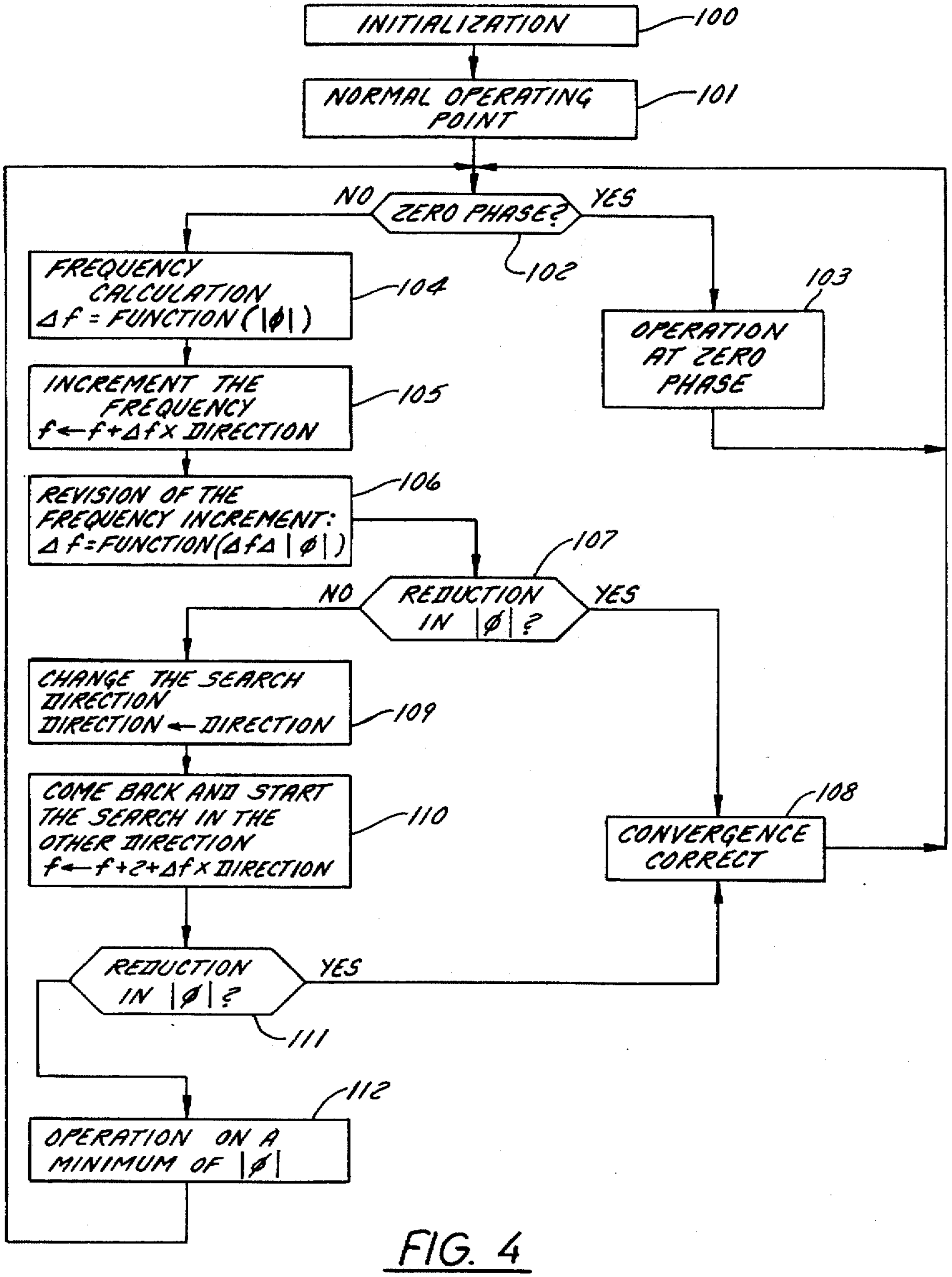
FIG. 4 is a flowchart for programming the computer used to implement the invention.

FIG. 4 represents a flowchart for programming the computer. After the initialization phase 100, which makes it possible, as will be seen later, to define the normal operating point 101 of the system, the value of the phase is tested at 102. If the phase is zero, the frequency f remains unchanged (operation at zero phase 103). If the phase is not zero, the computer calculates (stage 104) a frequency increment Δf as a function of the absolute value of the phase |Φ|, then increments (stage 105) the frequency by the value +Δf or −Δf, then revises the frequency increment as a function of the variation in the absolute value of the phase (stage 106).

At stage 107, the variation in the absolute value of the phase |Φ| is tested. If this value reduces, the system takes note, at 108, of correct convergence between the frequency variation applied at stage 105 and the change in phase, and returns to test 102 on the value of the phase.

If the absolute value of the phase increases, the sign applied to the frequency increment is changed (stage 109) and the frequency is incremented by 2×Δf (stage 110), which corresponds to an about turn on the frequency axis with respect to the variation applied at stage 105. The change in the absolute value of the phase is again tested (stage 111). If this value is reducing, the correct convergence between the frequency variation applied and the change in phase is noted. Otherwise, it means that whatever the direction of variation in frequency applied, the absolute value of the phase cannot be reduced, and operation at a phase minimum being noted, 112, and the test 102 on the value of the phase is repeated.

Figure 5:
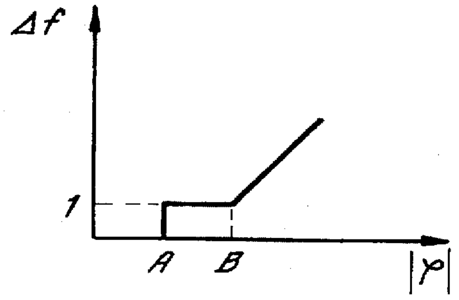
FIG. 5 represents the variation in the frequency correction applied to the oscillator as a function of the absolute value of the phase.

The calculation of the frequency increment Δf is carried out according to the graph of FIG. 5. It is seen that, if the absolute value of the phase |Φ| is less than a first predetermined threshold A, the value assigned to Δf is zero. If |Φ| lies between the first threshold A and a second threshold B, the value assigned to Δf is constant. And if |Φ| is greater than the said second threshold B, the value assigned to Δf increases as a function of |Φ|.

The method according to the invention is implemented in an industrial installation in two phases. The first phase is an initialization phase and the second phase is the slaving phase proper, which is carried out in accordance with the diagram described above, while the installation is operating.

In the case of a continuous-casting ingot mould, the useable frequency range is about 10 kHz to 30 kHz. The purpose of the initialization phase is to determine, within this range, the initial frequency $f_0$ corresponding to optimum operation, in resonance or in anti-resonance as chosen by the operator. To do that, an initialization datum voltage $U_{i0}$ is set, of a reduced value with respect to the rated voltage $U_0$ which will be applied to the actuators during the normal operation of the installation, and a frequency scan is performed within the predefined frequency range. In the course of this scan, the strength of the current and the phase are measured. The initial frequency $f_0$ is determined, corresponding to maximum current for zero phase if the operator has chosen to work at resonance, or to a minimum current for zero phase if he has chosen to work at anti-resonance. If there is no zero phase within the frequency range scanned, the frequency $f_0$ adopted is that at which the absolute value of the phase is a minimum.

A second frequency scan is preferably performed over a reduced frequency range, for example −500 Hz to +500 Hz around the predetermined frequency, in order to refine the result.

The operator has the possibility, prior to initialization, of setting the frequency range, the type of search (resonance or anti-resonance) and the voltage used for this search.

After the initialization, the initial frequency $f_0$ is displayed on the screen 8, and the user can also view the curves of phase and of current as a function of frequency, determine the slope of the phase curve close to the selected operating point and view the various frequencies yielding zero phase with the corresponding impedances.

The operator can also adjust the sampling frequency of the slaving, the regulation values (thresholds A and B and gain) and the datum voltage $U_0$ to be used during operation. The sampling frequency is chosen in such a way that, as already indicated previously, the sampling period is greater than the response time of the system in open loop, while remaining low in order to minimize the lag error. The sampling frequency could be 100 Hz, for example. In combination with the choice of the sampling frequency, the threshold and gain values can be matched so as to act on the speed of reaction of the system, that is to say the rapidity of variation of the frequency, which may be from 10 to 100 Hz per second, for example, depending on the slope of the phase curve in the vicinity of the optimal operating point. These various options for adjustment especially allow the device to be used for a very wide range of applications and whatever the actuators may be.

After the initialization phase, carried out at reduced power on the installation before the start of casting, by applying the initialization voltage $U_{i0}$ to the actuators, the slaving and casting are started and the power of the vibrations is raised by progressively increasing the voltage U applied to the actuators up to its rated operating value $U_0$.

During the slaving, the screen displays various indications on the operation of the system, especially an indication of operation at zero phase or at a minimum absolute value of the phase, and alarms in the event that the frequency reaches the limits of the authorized frequency range.

Shutdown is performed by progressively reducing the voltage applied to the actuators.

The speed of variation of the voltage at startup and at shutdown of the slaving can also be adjusted. In order to limit the variations in power, particularly during startup in order to allow the slaving to maintain the phase at the minimum despite the sizeable variations in load occurring during the rise in power, the speed of variation of the voltage will be limited, for example to $U_0/10$ volts per second. This will be the same during shutdown in order to avoid the slaving falling out of lock before the vibrations are completely stopped.

The invention can easily be implemented by means of a microcomputer programmed as previously indicated and equipped with an acquisition card and with interface units between the computer and the measurement and power circuits. These interfaces will be provided with high-quality insulation transformers and with amplifiers in order to avoid the stray effects which may result from the use of high voltages, of the order of 1000 V, for supplying the actuators.

The use of a microcomputer allows great flexibility in use. The slaving program may, however, also be implemented by means of specific circuits according to the techniques known in electronics.

The possibility of adjusting the various parameters allows the direct use of the device according to the invention for numerous industrial applications, the matching of the slaving characteristics to the various types and configurations of actuators used in these various applications possibly being done automatically, by a calibration procedure.

By ensuring that the industrial installation and the electrical power generator operate under optimum conditions, whatever the vibratory characteristics of the installation and their variations during operation, the reliability of the hardware used, and especially that of the piezoelectric chips, is greatly improved.

It is emphasized that the invention is not limited in application to piezoelectric emitters.

Magnetostrictive emitters can also be used to generate the ultrasonic power. The principle of operation at resonance or at anti-resonance is the same as with piezoelectric generators. Put simply, the current then has priority over the voltage, while the opposite situation applies in the case of piezoelectric generators.

We claim:

1. Method of driving power ultrasonic actuators (2), which are used to generate power ultrasound in an installation (1), according to which the frequency of an oscillator (3) for driving the said actuators is adjusted as a function of the phase (Φ) between the voltage and the current of the signal supplied by the said oscillator, characterized in that before putting the installation into service, a nominal frequency ($f_0$) of the signal is determined, depending on the said installation, and, when the installation is put into service:

the said phase (Φ) is continuously measured, a measurement sampling cycle is defined having a determined period, the sign of the variation in the absolute value (|Φ|) of the phase is determined in the course of each sampling period, and a frequency correction is applied to the frequency of the oscillator, in the same direction as the frequency correction applied previously if the variation in absolute value of the phase is negative, and in the opposite direction if the variation in absolute value of the phase is positive, and, if the variation in absolute value of the phase is zero, a frequency correction of random sign is applied.

2. Method according to claim 1, characterized in that, if the absolute value of the phase is zero or less than a first predetermined threshold, the frequency correction is zero.

3. Method according to claim 2, characterized in that, if the absolute value of the phase is less than a second predetermined threshold, the frequency correction is constant.

4. Method according to claim 2, characterized in that, if the absolute value of the phase is greater than a second predetermined threshold, the frequency correction increases as a function of phase.

5. Method according to claim 1, characterized in that the nominal frequency ($f_0$) is determined in an initialization phase by carrying out a frequency scan at an initial datum voltage ($U_{i0}$) and by selecting the frequency for which the measured phase is zero or a minimum and the strength of the current is a minimum or maximum.

6. Method according to claim 5, characterized in that, upon putting the installation into service, the voltage is progressively increased up to a predetermined operating datum voltage ($U_0$).

7. Device for driving power ultrasonic actuators including an oscillator (3) supplying a signal of adjustable frequency and means (4, 5) of measuring the phase between the voltage and the current of the said signal, characterized in that it includes a computer (6) for determining the direction of variation of the phase in the course of a cycle of predetermined duration and for calculating and applying a frequency correction of the signal to the oscillator as a function of the said direction of variation of the phase, the said frequency correction being in the same direction as the frequency correction applied previously if the variation in absolute value of the phase is negative, and in the opposite direction if the variation in absolute value of the phase is positive, and, if the variation in absolute value of the phase is zero, a frequency correction of random sign is applied.

8. Device according to claim 7, characterized in that it includes means of adjusting the voltage of the signal.

* * * * *